US010587183B2

United States Patent
Lehmeyer et al.

(10) Patent No.: US 10,587,183 B2
(45) Date of Patent: Mar. 10, 2020

(54) ELECTRONIC AMPLIFIER FOR AMPLIFYING AN INPUT SIGNAL

(71) Applicant: TECHNISCHE UNIVERSITAET MUENCHEN, Munich (DE)

(72) Inventors: Bernhard Lehmeyer, Dachau (DE); Amine Mezghani, Munich (DE); Josef Nossek, Iffeldorf (DE)

(73) Assignee: Technische Universitaet Muenchen, Munich (DE)

( * ) Notice: Subject to any disclaimer, the term of this patent is extended or adjusted under 35 U.S.C. 154(b) by 0 days.

(21) Appl. No.: 16/266,723

(22) Filed: Feb. 4, 2019

(65) Prior Publication Data

US 2019/0173375 A1 Jun. 6, 2019

Related U.S. Application Data

(63) Continuation of application No. PCT/EP2017/069491, filed on Aug. 2, 2017.

(30) Foreign Application Priority Data

Aug. 3, 2016 (EP) ..................................... 16182602

(51) Int. Cl.
*H02M 1/34* (2007.01)
*H03F 3/217* (2006.01)
*H02M 7/537* (2006.01)
*H02M 1/088* (2006.01)

(52) U.S. Cl.
CPC ............ *H02M 1/34* (2013.01); *H02M 1/088* (2013.01); *H02M 7/537* (2013.01); *H03F 3/2173* (2013.01)

(58) Field of Classification Search
CPC .. H02J 50/12; H02J 7/025; H02J 5/005; H02J 50/80; H02J 50/90; H02M 3/00; H02M 1/156; H02M 3/07; H02M 1/34; H02M 1/44; H02M 7/48
USPC ....................................................... 327/553
See application file for complete search history.

(56) References Cited

U.S. PATENT DOCUMENTS

| 9,293,999 | B1 * | 3/2016 | Lam ................. H02M 3/33546 |
| 2003/0206422 | A1 | 11/2003 | Gucyski | |
| 2011/0062927 | A1 * | 3/2011 | Nagasawa ............. H02M 3/156 |
| | | | 323/282 |

* cited by examiner

*Primary Examiner* — John W Poos
(74) *Attorney, Agent, or Firm* — Laurence A. Greenberg; Werner H. Stemer; Ralph E. Locher

(57) ABSTRACT

An electronic amplifier for amplifying an input signal has a branching node, a supply branch, a balance branch, an auxiliary branch and a load branch. All of the branches are connected in parallel to each other relative to the branching node and a reference potential. The supply branch supplies a DC voltage to the branching node. The balance branch absorbs and/or storing electric energy. A current supply device supplies a DC current. The control switch, the current valve and the current source are in different branches. The control switch, in a pass current state, establishes a current flow from the supply branch into either the auxiliary branch or the balance branch. In the block current state, current flows from the current supply device to the balancing device. The supply, balance and auxiliary branches provide an amplified signal to the load, controlled only by the input signal at the control switch.

16 Claims, 5 Drawing Sheets

ELECTRONIC AMPLIFIER FOR AMPLIFYING AN INPUT SIGNAL

CROSS-REFERENCE TO RELATED APPLICATION

This application is a continuation, under 35 U.S.C. § 120, of copending international application No. PCT/EP2017/069491, filed Aug. 2, 2017, which designated the United States; this application also claims the priority, under 35 U.S.C. § 119, of European patent application No. EP 16182602.9, filed Aug. 3, 2016; the prior applications are herewith incorporated by reference in their entirety.

BACKGROUND OF THE INVENTION

Field of the Invention

The invention is related to an electronic amplifier for amplifying an input signal. The amplifier comprises: a branching node, a supply branch, an auxiliary branch and a load branch. All of the branches are in parallel connection to each other in relation to the branching node and a reference potential. The supply branch comprises at least one DC voltage supply configured to supply a DC voltage to the branching node. The amplifier further comprises a control switch to be switched between a pass current state and an block current state in dependence of the input signal. The supply branch and the auxiliary branch are configured to provide an amplified signal to the load branch. The amplified signal is controlled only by the input signal.

The amplification of an electronic signal is one of the key tasks in many fields of electronics, especially in telecommunications engineering and consumer electronics. A signal originating from a signal receiver part of a telecommunication device or generated by a readout process in an audiovisual device is amplified in order to be further processed and then played back or transmitted by some playback or signal transmission part.

Typically, signal processing takes place in integrated circuits which are designed to be as small as possible due to reasons of space. Furthermore, the signal processing shall be as power efficient as possible, especially when containing huge numbers of logical operations as is the case for processing, say, audio signals in both telecommunications and sound systems. The size limitations also have an influence on the maximum power the components involved can support, as well as they limit the maximum voltages to be supplied to certain signal processing components such as transistors in order to avoid a burst event. However, the transmission of a telecommunication signal or the playback of an audio signal typically requires higher powers and voltages than the ones used in the signal processing steps such that the processed signals in this case are amplified. Again, the amplifications step preferably is to be carried out in a power efficient way. This holds especially in mobile telecommunication devices where battery charge is an important issue.

There are several basic classes of electronic amplifiers whose application is typically chosen according to the required gain, the frequency range of the signal to be amplified, the power available to the amplifier, the maximum size allowed in the application and further parameters of the kind.

Amplifiers of class A, B, A/B and C are characterized in that active control elements are used with a linear characteristic, i.e., at least during the time of operation of a particular control element, the output signal is proportional a the input signal controlling the control element. Distortion, i.e., non-linear behavior may enter the output signal of the amplifier due to the operation time of a control element not covering a full period of the input signal, thus effectively introducing harmonics by this truncation of the input signal. Due to the linear behavior of the employed control elements during operation time, considerable power losses are inevitable as a consequence of a synchronous current flow over a voltage drop at the control element. This limits the power efficiency, defined by the output power divided by the power consumption of a power supply or similar device. For this reason, the cited amplifiers are mainly used in applications where a good output signal quality is desired and the absolute output power is low so that efficiency is not so much of an issue, i.e., in pre-amplification steps for controlling an amplifier with a higher output power.

In the amplifiers of class D at least two active control elements are used as on-off-switches in push-/pull operation controlled by an input signal which, depending on the load, may be pulse-width modulated (PWM). Due to the switching, there is hardly any power loss at the control elements, and therefore class D amplifiers are commonly used as power amplifiers due to their high efficiency in normal operation (up to more than 90%).

However, at increasing frequencies for the input signal and, thus, for the switching periods, the power losses become more of an issue. Likewise, the output signal of a class D amplifier typically needs to be filtered due to the switching peaks, leading to further problems in the adjustment to switching at increasing frequencies.

SUMMARY OF THE INVENTION

It is accordingly an object of the invention to provide an amplifier for amplifying an input signal which overcomes the above-mentioned and other disadvantages of the heretofore-known devices and methods of this general type and which may output a high power output signal with a good power efficiency even in case the input signal which controls the amplifier is in the high frequency range.

With the foregoing and other objects in view there is provided, in accordance with the invention, an electronic amplifier for amplifying an input signal, the amplifier comprising:

a branching node;

a plurality of branches connected in parallel connection to one another relative to said branching node and a reference potential, said plurality of branches including a supply branch, a balance branch, an auxiliary branch and a load branch;

said supply branch including at least one DC voltage supply configured to supply a DC voltage to said branching node;

said balance branch including a balancing device configured to absorb and/or store electric energy;

a current supply device configured to supply a DC current;

a control switch to be switched between a pass current state and a block current state in dependence of the input signal;

a voltage-dependent current valve configured to conduct a substantial DC current in one direction;

each of said control switch, said current valve and said current source being disposed in a different one of said supply branch, said balance branch and said auxiliary branch;

said control switch being configured, in the pass current state, to establish a current flow from said supply branch through said current supply device into either said auxiliary branch or said balance branch;

said control switch being configured, in the block current state, to establish a current flow from said current supply device to said balancing device by way of said current valve; and said supply branch, said balance branch and said auxiliary branch being configured to provide an amplified signal to said load branch, the amplified signal being controlled only by the input signal at said control switch.

In other words, the objects of the invention are attained by an electronic amplifier for amplifying an input signal, comprising: a branching node, a supply branch, a balance branch, an auxiliary branch and a load branch, wherein all of the branches are in parallel connection to each other in relation to the branching node and a reference potential, wherein the supply branch comprises at least one DC voltage supply configured to supply a DC voltage to the branching node, wherein the balance branch comprises a balancing device configured to absorb and/or to store electric energy, the amplifier further comprising a current supply device configured to supply a DC current, a control switch to be switched between a pass current state and a block current state in dependence of the input signal, a voltage-dependent current valve configured to conduct a substantial DC current in one direction, wherein each of the control switch, the current valve and the current source is disposed in a different one of the supply branch, the balance branch and the auxiliary branch, wherein the control switch in the pass current state is configured to establish a current flow from the supply branch through the current supply device into either the auxiliary branch or the balance branch, wherein the control switch in the block current state is configured to establish a current flow from the current supply device to the balancing device by means of the current valve, and wherein the supply branch, the balance branch and the auxiliary branch are configured to provide an amplified signal to the load branch, said amplified signal being controlled only by the input signal at the control switch. Embodiments of particular advantage are given in the dependent claims and the description following below.

The notion of a voltage-dependent current valve comprises any device whose current-voltage characteristic shows a substantial current only starting from a determined, non-zero voltage value of certain polarity while essentially blocking any current flow below said voltage value of the proper polarity. Preferably the current valve is blocking any current flow for any voltage of the opposite polarity which reasonably may occur during operation, wherein the pass/block current mechanism in its voltage dependence is reversible, i.e., the device reversibly switches between a pass current state and a block current state depending only on the voltage on the device. This does not prevent said device from possibly having a breakdown voltage at which operation may not be reversible anymore, as long as the breakdown voltage is much larger than any voltage which reasonably may occur during operation.

The term "substantial current" shall comprise a current flow suitable for a power transmission from the amplifier to a load, while leakage currents and the like in active devices which are at least an order of magnitude below the currents occurring during a phase of scheduled current flow according to the provision and the design of the amplifier shall not contribute to this power transmission. Likewise, the pass current state of the control switch is defined as a state in which the control switch is set up and arranged to conduct a substantial current at an impedance as low as technically possible and negligible compared to other impedance values in the amplifier's circuit, while the block current state is defined as a state in which the control switch does not conduct any substantial current driven by a current supply device. Preferably, the load branch comprises at least one connection port for connecting a load.

The starting point for the invention is taken within the known designs for electronic amplifiers.

The amplifiers of class A are characterized in that they can be implemented with only one single active control element (such as a transistor) wherein during any full period of the input signal to be amplified, and thus, during the whole time of operation, the control element is always conducting a substantial amount of current, which limits the efficiency of a class A amplifier to only 25%. An amplifier of class B typically comprises at least two active control elements in a "push/pull" arrangement, such that each of the control elements can be acting on either a positive or a negative half-period of a zero-mean input signal. Thus, as this allows for the use of covering the amplification of each of the half-waves of the input signal by a different power supply, in the inactive half-period the current in the respective control element may be chosen to be zero, which helps increase the efficiency up to a theoretical 78%.

However, as the push/pull set-up effectively consists of an arrangement of two half-wave amplifiers, distortion is introduced into the amplified signal at the crossing of the half-periods. The AB amplifier class tries to overcome this, maintaining each of the active control elements in operation for slightly longer than only a half period of the input signal as to generate an overlap between the two control elements' operation times in order to reduce this distortion, at the cost of lowering slightly the efficiency compared to a true push/pull class B amplifier. An amplifier of class C comprises one control element which is active on less than a half-period of the input signal, leading to a substantial amount of distortion in the output signal which typically needs to be filtered out by a corresponding network. Even though the operating point can be chosen to avoid a current in the control element if the input signal has no amplitude, allowing for very high efficiencies (up to a theoretical 100% in case of ideal implementation), the filtering network implies the need for more devices and components, in particular with high inductivities, which often is not wanted.

In order to achieve a higher power efficiency with no need for extensive filtering, an amplifier of class D may be used in which at least two control switches in push-/pull operation are set into either a pass current state or a block current state. A typical amplifier of class D comprises an auxiliary branch with a first control switch, a supply branch with a DC voltage source in series connection with a second control switch, and a load branch, the three branches in being parallel connection with respect to a branching node and a reference potential.

Due to the switching, there is hardly any power loss at the control elements, as there is either no substantial resistance and thus, no real voltage drop in the pass current state, or no substantial current flow in the block current state. The switching losses however increase with the frequency of both the input signal and the switching period. The voltage peaks at each switching stage typically need to be filtered out by a filter network in order to not damage the control switches or other components of the amplifier or of the load circuit. Furthermore, the input signal has to be very accurate in order to neither allow for a short-cut (i.e., both switches in the pass current state) nor for both switches being in the block current state, as the devices which are typically used as control switches, such as transistors, may be damaged in this case by currents pumped back into the amplifier from components in the filter network.

At high frequencies, in particular up to one third of a transit frequency of a control switch, the accuracy of switching is further complicated by the fact that a transistor typically needs longer to be switched into the off-state when being in the on-state than reversed. This complicates the operation as the transition time from the pass current state to the block current state and vice versa for each control switch has to be taken into account when triggering the control switches via the input signal. As these transition times are mainly constant in frequency, the operation at high frequencies is increasingly cumbersome to control, especially if small modulations on the operating frequency are required, e.g., for a frequency modulation of a carrier signal.

Likewise, the second control switch in the supply branch has no fixed reference potential, such that it floats with the potential of the branching node. This floating has to be taken into account when controlling the corresponding switch via its input signal, i.e., in a pre-amp stage. A possible adjustment for the floating potential of the second control switch gets increasingly challenging at higher frequencies, as well. The mentioned drawbacks become even more prominent for class D amplifiers with a higher complexity in the circuitry.

According to the invention, the mentioned problems are solved by first: using only one control switch to be controlled by the input signal, second: providing one further branch—denoted as balance branch—in parallel to the supply branch, the auxiliary branch and the load branch, the balance branch featuring a balancing device configured to absorb and/or to store electric energy, third: by providing a voltage dependent current valve, and fourth: by providing a current supply device configured to supply a current to the balancing device by means of the current valve when the control switch is in a block current state.

The use of only one control switch avoids the need for the cumbersome fine tuning of the delicate transition when the two control switches are changing their respective switching state. In particular, the asymmetry in the behavior when on the one hand switching from the pass current state to the block current state and on the other hand switching from the block current state to the pass current state, the latter one being faster at a substantial level in high frequencies for the devices typically used as control switches, need not be addressed any more.

Furthermore, there is also no need for adjusting the second control switch for its potential floating with the branching node's. Typically, due to technical restrictions on the maximal gains and the typical signal power of devices generating the input signal, the second input signal needs to be pre-amplified in a pre-amp stage. Such a pre-amp stage may comprise a set of charge pumps, which now are obsolete.

The control switch controlling the amplifier's operation is switched for a half period of the input signal, leading to an amplified signal for this half period being provided to the load branch and furthermore to an energy input into the current supply device. The remaining half period of the input signal the switch is in a block current state, leading to a voltage increase at the current valve, and thus, to a current flow through the current vale. The current supply device then provides a current to the balancing device, while though the whole period of operation, additional energy from undesired harmonic frequencies in the load branch is also led to the balancing device. The balancing device in particular may be given by an energy recovering unit in order to recover said energy from the unwanted harmonic frequencies in the load branch due to the switching of the control switch. Preferably, the energy recovery unit is connected to the DC voltage supply in the supply branch so that the energy recovered during the use of the amplifier can directly be used again for its operation. In case the voltage provided to the branching node by the amplifier may temporarily deviate from the voltage supplied by the DC voltage supply in the supply branch (other than the reference potential), the connection preferably comprises an appropriate, in particular low-loss or lossless conversion circuit. Furthermore, the balancing device may comprise or may be given by an energy sink which absorbs said energy, e.g., by means of its resistance. Advantageously, the operation of the balancing device does not include any voltage dependent current valve clamped in backward direction against the branching node.

In a preferred embodiment, the current source is operated without any parallel flyback diode or similar current valve in its branch, i.e., the maximum voltage attainable at the branching node w. resp. to the reference potential is not limited by any device limiting the maximal current provided by the current source towards the branching node. Due to the presence of the balancing device, such a limitation is no longer necessary since any excess current which might lead to critical voltages at the branching node possibly harmful to the switching device or to the load can now be fed into the balancing device without endangering the structural integrity of the amplifier and its components, respectively.

The mechanism described for the operation of the amplifier leads to restrictions on the possible topological implementation of the amplifier circuit. Some preferred embodiments will be explained in detail in the following. It is immediately clear from the well known laws of the duality of circuits that the invention shall comprise the respective dual circuits as well, which may be obtained by interchanging voltages with currents, parallel connections with series connections, and inductors with capacitors.

In a preferred embodiment, the current supply device is disposed in the supply branch, the current valve is disposed in the balance branch, and the control switch is disposed in the auxiliary branch, wherein the control switch in the pass current state is configured to establish a current flow from the supply branch through the current supply device into the auxiliary branch, and wherein the control switch in the block current state is configured to establish a DC current flow from the current supply device through the current valve to the balancing device. Preferably, the current supply device is disposed in the supply branch in series connection between the DC voltage supply and the branching node, and most preferably, no flyback diode or similar current valve is set up in the supply branch in parallel to the current supply device, allowing thus for a particular high output voltage.

Topologically, the described setup comprises a step-up converter formed by the supply branch, the auxiliary branch and the balance branch with their respective components as mentioned, wherein the DC voltage supply in the supply branch takes the role of the power supply of the step-up converter, the current supply device takes the role of the inductor of the step-up converter, the current valve takes the role of the diode of the step-up converter, and the up-converted voltage is fed to the balancing device. This set-up helps to get a smooth amplified signal at the load, as the energy of harmonics is led to the balancing device without the need for neither further switching operations nor a complex filtering network.

Hereby the current valve preferably is connected in series connection between the branching node and the balancing device, and/or the control switch is connected in series connection between the branching node and the reference potential. Connecting the current valve in series between the branching node and the balancing device allows for a wide range of possible balancing devices as no further current flow beyond the balancing device is needed for proper operation. Connecting the control switch in series between the branching node and the reference potential ensures the branching node to be at reference potential in the pass current state and at least at the potential of the DC voltage source output, preferably at twice the DC source voltage, in the block current state, i.e., the branching node to which the load is connected can be set to a well defined rectangular potential during operation.

According to yet another preferred embodiment, the current supply device is disposed in the balance branch, the current valve is disposed in the auxiliary branch, and the control switch is disposed in the supply branch, wherein the control switch in the pass current state is configured to establish a current flow from the supply branch through the current supply device into the balance branch, and wherein the control switch in the block current state is configured to establish a DC current flow from the current valve through the current supply device to the balancing device. Preferably, the current supply device is disposed in the balance branch in series connection between the branching node and the balancing device, and most preferably, no flyback diode or similar current valve is set up in the balance branch in parallel to the current supply device, allowing thus for a particular high output voltage.

Topologically, the described setup comprises a step-down converter formed by the supply branch, the auxiliary branch and the balance branch with their respective components as mentioned, wherein the DC voltage supply in the supply branch takes the role of the power supply of the step-down converter, the current supply device takes the role of the inductor of the step-down converter, the current valve takes the role of the diode of the step-down converter, and the down-converted voltage is fed to the balancing device. This set-up helps to get a smooth amplified signal at the load, as the energy of harmonics is led to the balancing device without the need for neither further switching operations nor a complex filtering network.

Hereby the current valve preferably is connected in series connection between the reference potential and the branching node, and/or the control switch is connected in series connection between the DC voltage supply and the branching node. Connecting the current valve in series between the reference potential and the branching node allows for a negative current flow from the reference potential to the balancing device driven by the current supply device. Connecting the control switch in series between the DC voltage supply and the branching node ensures the branching node to be at reference potential in the block current state and at most at the potential of the DC voltage source output, preferably half the DC source voltage, in the pass current state, i.e., the branching node to which the load is connected can be set to a well defined rectangular potential during operation.

Further amplifier topologies apart from the setting comprising a step-up converter and the setting comprising a step-down converter may be implemented.

In another advantageous embodiment, the load branch further comprises a band pass filter in series connection with a connection port, said band pass filter being configured to filter a filter frequency band at a center frequency matching a working frequency of the load. In particular, the connection port is configured for connecting a load to the load branch. Preferably, the band pass filter comprises at least one inductor and one capacitor in series connection. The center frequency of the band pass filter is understood to be matching a working frequency of the load when the load has one preferred frequency at which it is operated as scheduled and provisioned, and the center frequency of the band pass filter is approximately equal to said working frequency, i.e., the absolute deviation between the two mentioned frequencies is orders of magnitude smaller than either of the two frequencies, and the operating frequency lies well within the half-power bandwidth of the band pass filter. If the load has a working frequency as explained above, e.g. in case of a telecommunication antenna as the load, the working frequency being the carrier frequency for signal transmission, the band pass filter passes energy components close to the working frequency into the load. Harmonics can be filtered out by the band pass filter returning their energy towards the branching node so that it can be recovered by the balancing device. This is of particular advantage in case that a mechanism for returning the recovered energy to the DC voltage source is employed, as well. In this case, the energy for unwanted harmonics which would be typically lost when filtering out the harmonics can now be used for the operation of the amplifier, thus improving its power efficiency.

Hereby for the amplifier it is of particular advantage to be further configured to amplify an input signal at a frequency corresponding to the center frequency of the band pass filter. The center frequency of the band pass filter is understood to be matching the frequency of the input signal if the absolute deviation between the two mentioned frequencies is orders of magnitude smaller than either of the two frequencies, and the frequency of the input signal lies well within the half-power bandwidth of the band pass filter. If the frequency of the input signal matches the center frequency of the band pass filter, then for a given power supplied from the DC voltage supply to the branching node, a particularly high output power can be reached in the amplified signal, as the amount of harmonics whose energy is fed back towards the balancing device can be minimized.

In a further preferred embodiment the current supply device is given by at least one inductor. Preferably, the inductor operates as a current supply device due to its inductance upon changes its voltage, the changes of the voltage at the inductor being implemented by the control switch setting or interrupting a connection from the inductor to the DC voltage supply. Using an inductor as a current supply device in the described way, there is no need for an active current supply with a power supply of its own. Instead, the inductor when operating as a current supply device leads to an increase in the power consumption of the DC voltage supply. Preferably, the inductor is operated without any flyback diode or similar current valve in parallel within the same branch.

In yet another preferred embodiment, the balancing device comprises an energy recovery unit configured to store energy from a DC current led into the balance branch. This may help to increase the power efficiency of the amplifier, as the energy of harmonics unwanted in the load branch can be recovered up to a degree essentially depending only on the power efficiency of the energy recovery unit, thus not contributing to the power consumption in the denominator of the power efficiency. Furthermore, the energy recovery unit may help to avoid voltage peaks and cross currents caused by the energy of the unwanted harmonics in the amplifier's circuit.

Preferably, the energy recovery unit is suitable and configured to store energy from a DC current wherein the total energy capacity of the energy recovery unit exceeds by at least two orders of magnitude, most preferably more than three orders of magnitude, the average energy fed back from the load branch to the balance branch during operation. The energy stored may be used for the operation of the amplifier itself, in particular for supplying power to the load branch, or for another application which is used in the context of the operation of the amplifier, e.g. a pre-amp, or signal processing of the input signal.

Hereby, the energy recovery unit preferably comprises a rechargeable DC voltage supply or is connected with a rechargeable DC voltage supply. This way, the energy recovered by the energy recovery unit may be transferred by a suitable circuitry to the DC voltage supply of the supply branch. Preferentially, said rechargeable DC voltage supply is configured to provide a DC voltage larger than the DC voltage supplied by the DC voltage supply of the supply branch, in particular twice that voltage, if the amplifier's topology corresponds to a step-up converter setting. Furthermore preferentially, said rechargeable DC voltage supply is configured to provide a DC voltage smaller than the DC voltage supplied by the DC voltage supply of the supply branch, in particular half of that voltage, if the amplifier's topology corresponds to a step-down converter setting.

Advantageously, said rechargeable DC voltage supply is set up and configured to supply a DC voltage to the branching node via the supply branch. In particular, said rechargeable DC voltage supply may be given by the DC voltage supply of the supply branch. In this case, the energy recovery unit in particular may comprise an appropriate, preferably low-loss or lossless conversion circuit in order to convert the voltages at the branching node which may occur during operation to the voltage of the DC voltage supply. Preferably, to this end the voltage at the branching node during a block current state of the switching device may be kept at a fixed reference value instead of controlling the conversion circuit only in dependence of its output voltage.

In a preferred embodiment, the balancing device comprises an energy sink configured to absorb energy from a DC current led into the balance branch. Using such an energy sink can be of particular advantage if due to space reasons, an energy recovery unit is difficult to implement. The energy sink then can absorb the energy of harmonics unwanted in the load branch, helping thus to avoid voltage peaks and cross currents in the amplifier's circuit. This may also be of advantage when the balancing device also comprises an energy recovery unit. The energy recovery unit recovers the main energy components of the harmonics, while energy sink may absorb the highest peaks which could be harmful to the components of the amplifier, and in particular, to the energy recovery unit.

Hereby, the energy sink preferably comprises at least one resistor and one capacitor in parallel connection. The resistor may simply absorb the received electrical energy by converting it essentially into heat, while the capacitor in parallel to the resistor helps to stabilize the voltage at the branching node from the balance branch when switching the control switch.

Advantageously, the current valve is given by one of a MOSFET and a Schottky diode, the Schottky diode being clamped in forward direction towards the balancing device. In particular, the Schottky diode is clamped in series connection and forward direction between the branching node and the balancing device if the amplifier's topology corresponds to a step-up converter setting, or it is clamped in series connection and forward direction between the reference potential and the branching node if the amplifier's topology corresponds to a step-down converter setting. Taking a Schottky diode as the current valve has a further advantage in the response time to a change in the voltage applied to the current valve. In a Schottky diode, minority carriers do not contribute to the current transport, so that the recombination time of the minority carriers which may lead to problems in the response time in other semiconductor devices is no issue here.

In yet another preferred embodiment, the amplifier is being configured to amplify an essentially square-shaped input signal. A square-shaped input signal is to be understood as a signal whose voltage can attain either of only two values, and the transition time between those two values is negligible on the time scale relevant for the processes in the amplifier. Square shaped signals are easy to generate in integrated circuits and appear in many applications.

In a further preferred embodiment, the control switch is given by a transistor, and the input signal is provided to either a base or a gate of the transistor. In particular, the transistor may be given by a FET, especially by a MOSFET. A transistor as a control switch allows for a particularly stable switching behavior.

Other features which are considered as characteristic for the invention are set forth in the appended claims.

Although the invention is illustrated and described herein as embodied in an electronic amplifier for amplifying an input signal, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

Parts and variables corresponding to one another are provided with in each case the same reference numerals in all figures.

DETAILED DESCRIPTION OF THE INVENTION

Figure 1:
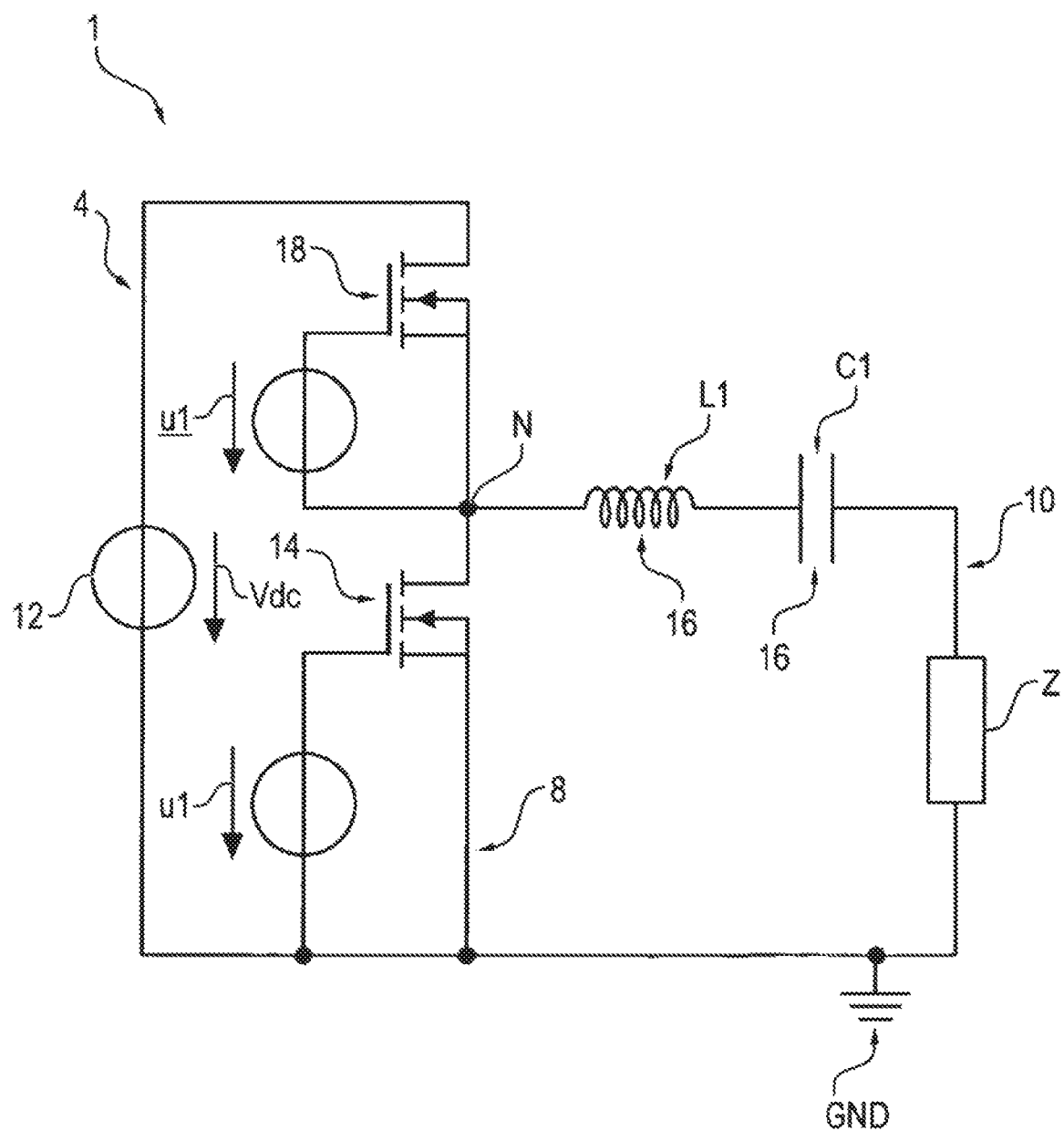
FIG. 1 shows a schematic diagram of a class D amplifier of the prior art.

Referring now to the figures of the drawing in detail and first, particularly, to FIG. 1 thereof, there is shown a schematic diagram of a prior art class D amplifier 1. The amplifier 1 comprises a supply branch 4, an auxiliary branch 8 and a load branch 10 in parallel connection with respect to a branching node N and a reference potential GND. In the supply branch 4 a DC voltage supply 12 configured to supply a DC voltage Vdc is disposed. The auxiliary branch comprises a control switch 14 controlled by an input signal u1. The control switch 14 here is given by a MOSFET, the square shaped input signal u1 acting on its gate. The control switch 14 is configured to take on either one of a pass current state and a block current state, wherein in the pass current state the control switch 14 shows no essential impedance beyond a ohmic behavior negligible for the operation of the amplifier 1 and in the block current state there is no substantial current flow in the control switch beyond negligible leakage currents orders of magnitude smaller than the currents for properly operating the amplifier 1. The load branch 10 comprises a load Z and band pass filter 16 with an inductor L1 and a capacitor C1 in series connection. The supply branch 4 further comprises another control switch 18 in series connection between the DC voltage supply 12 and the branching node N. This control switch 18 is controlled by the complementary input signal u1, i.e., when u1 showing the upper value for its voltage, then u1 is showing no voltage and vice versa. Also the control switch 18 in the supply branch 4 is given by a MOSFET wherein the complementary input signal u1 is acting on its gate.

The control of the amplifier 1 especially at high frequencies for the input signal u1 is complicated by the fact that the two control switches 14, 18 must not take on the same switching state. While for the pass current states, this is directly obvious, as this would lead to a short cut of the DC voltage supply 12. But also both control switches 14, 18 being in the block current state may endanger the integrity of the amplifier's 1 components, as a back flow current induced by the inductor L1 of the band pass filter 16 may increase the voltage at the branching node N up to a level which is no longer tolerable for the MOSFET control switches 14, 18. Moreover, the MOSFET control switches 14, 18 have a longer transition time for switching from the pass current state into the block current state than vice versa. The transition time, in which a control switch is in some sort of an intermediate transition state between the pass current state and the block current state, normally is not taken into account in the control of the amplifier 1, but as for a given type of MOSFET, it is a constant, its influence gets more and more remarkable for increasing frequencies of switching.

Furthermore, the voltage of the branching node N and thus, of the upper control switch 18 in the supply branch 4 "floats" according to the switching state of the control switch 14 in the auxiliary branch 8. Thus, a pre-amp stage (not shown here) for pre-amplifying the complementary input signal u1 has to be adjusted for these voltage jumps.

Figure 2:
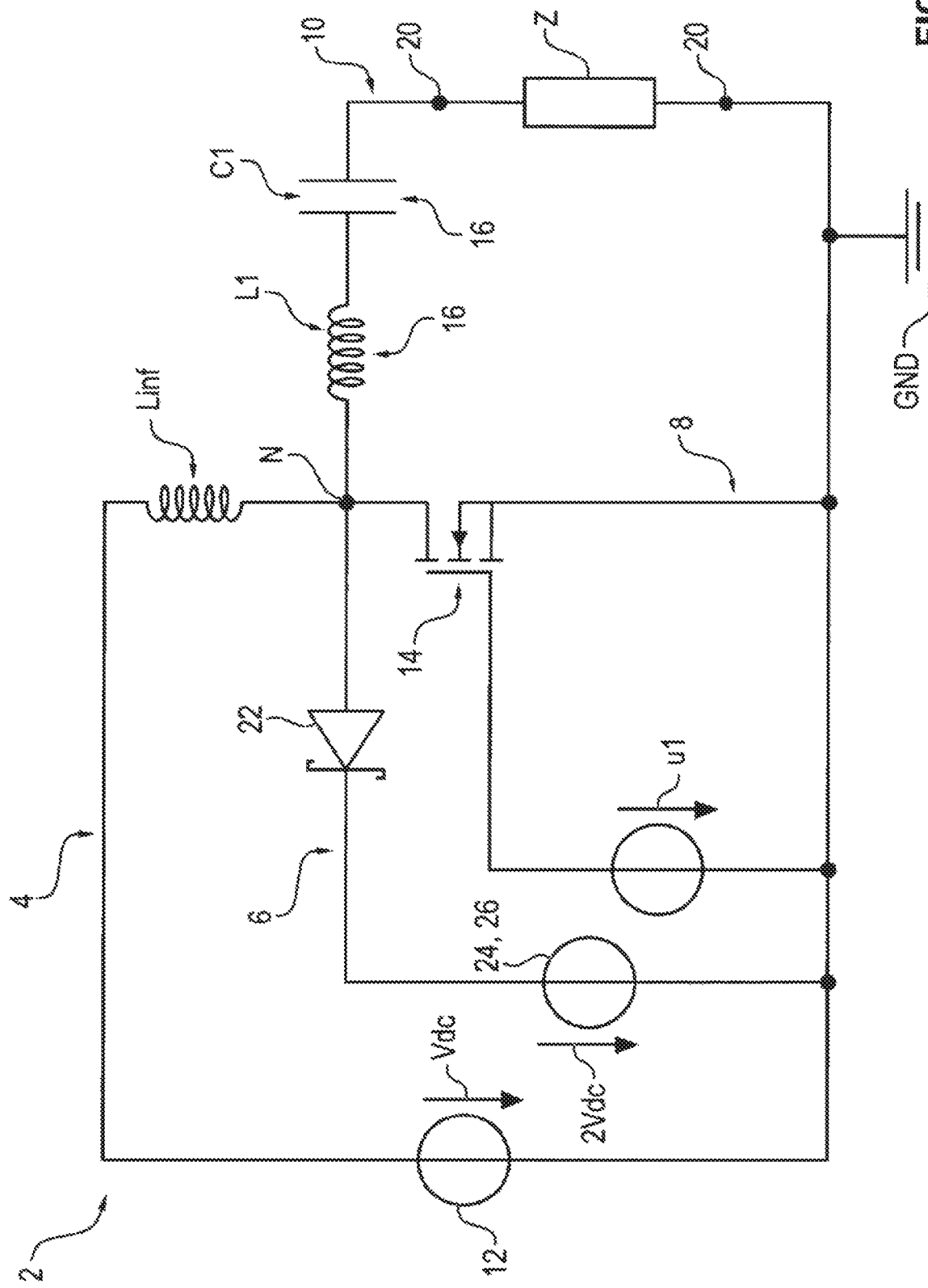
FIG. 2 shows a schematic diagram of one embodiment of an amplifier operating with only one control switch.

This may be resolved by an amplifier 2 schematically shown in FIG. 2, which shall be denoted furthermore as an amplifier of class M. The amplifier 2 of class M comprises a supply branch 4, an auxiliary branch 8 and a load branch 10, in parallel connection with respect to a branching node N and a reference potential GND, as it is the case in the class D amplifier 1 of FIG. 1. However, the amplifier 2 furthermore comprises a balance branch 6 connected in parallel to the other branches mentioned. The supply branch 4 apart from a DC voltage supply 12 configured to supply a DC voltage Vdc now also comprises a current supply device Linf in series connection to the DC voltage supply 12 and the branching node N. The current supply device Linf is given by an inductor with very high inductance. The auxiliary branch 8 comprises a control switch 14 controlled by a square shaped input signal u1, wherein again the control switch 14 is given by a MOSFET, the square shaped input signal u1 acting on its gate. The load branch 10 features a band pass filter 16 which in the present embodiment comprises an inductor L1 and a capacitor C1 in series connection, and two connection ports 20 for connecting a load Z in series with the band pass filter 16. The band pass filter 16, however, may also be of higher order. The balance branch 6 has a voltage dependent current valve 22, which here is given by a Schottky diode clamped in forward direction away from the branching node N towards a balancing device 24, the latter comprising an energy recovery unit 26 given by rechargeable DC voltage supply configured to supply a DC voltage of the amount of twice the voltage Vdc.

In this amplifier 2, the supply branch 4, the auxiliary branch 8 and the balance branch 6 and their respective components shown in FIG. 2 form some sort of a step-up converter, the up-converted voltage being directed towards the energy recovery unit 26. The band pass filter 16 in the load branch 10 provides for only a narrow frequency band around its center frequency passing towards the load Z connected to the connection ports 20, the center frequency of the band pass filter 16 matching the both the operation frequency of the load Z and the switching frequency given by the frequency of the input signal u1. Due to the square shape of the input signal u1, the amplified signal contains many higher harmonics of the input signal u1, which do not pass the band pass filter 16 towards the load. The energy content of these harmonics of the input signal u1 to be amplified is fed back into the energy recovery unit 26, helping to increase the power efficiency of the amplifier 2 due to this recovered energy. This might be done, e.g., with a circuit (not shown) connecting the energy recovery unit 26 and the DC voltage supply 12, said circuit comprising a step-down converter for converting the up-converted voltage at the branching node N down again to the voltage of the DC voltage supply 12.

Figure 3:
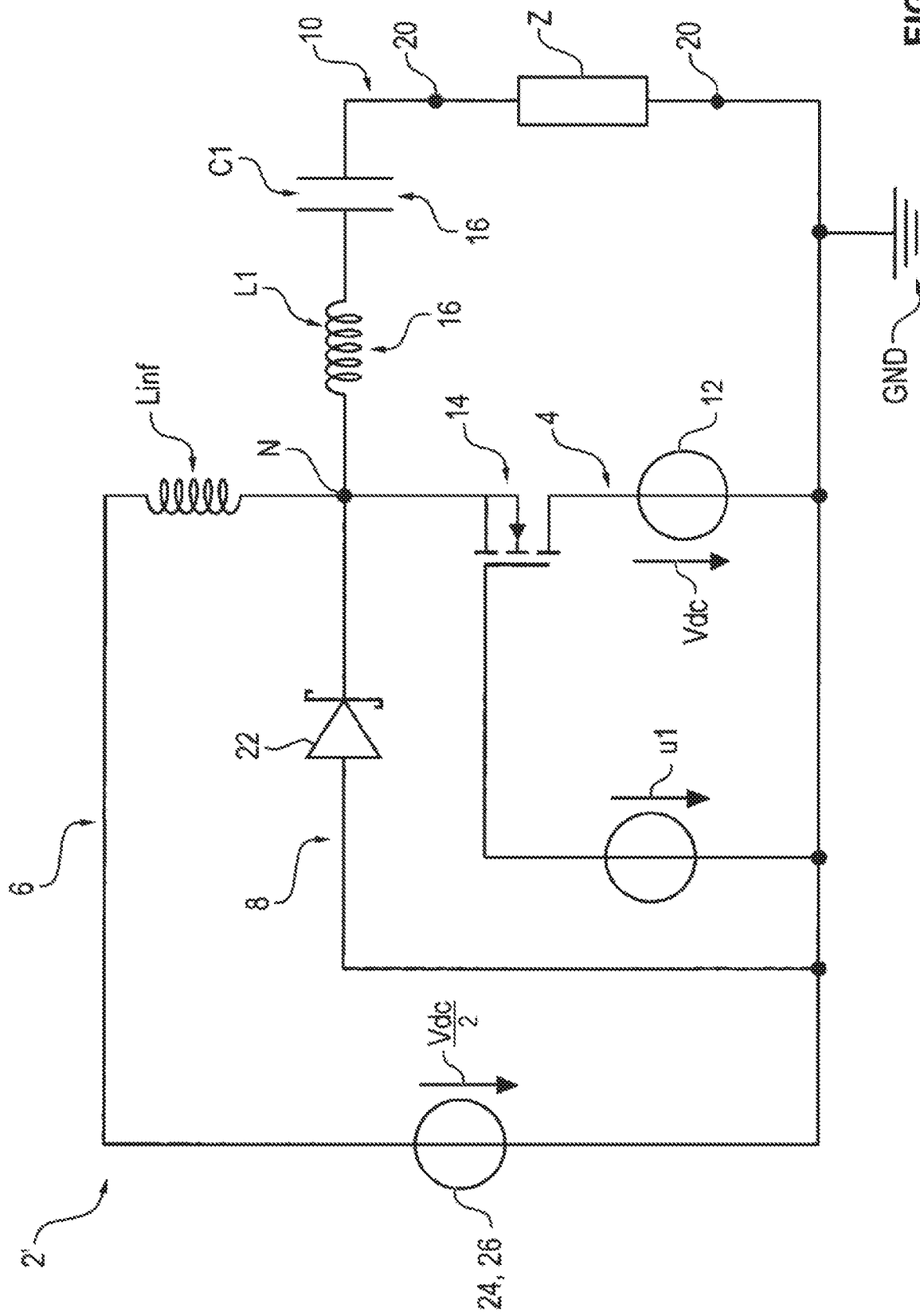
FIG. 3 shows a schematic diagram of another embodiment of an amplifier operating with only one control switch.

Another embodiment is given by an amplifier 2' schematically shown in FIG. 3, which shall be denoted as an amplifier of class N. The concept of the class N amplifier 2' is a topological rearrangement of the class M amplifier 2 shown in FIG. 2, thus exchanging the step-up converter comprised in the class M amplifier 2 by a step-down converter, as shown below. The amplifier 2' of class N comprises a supply branch 4, an auxiliary branch 8 and a load branch 10, in parallel connection with respect to a branching node N and a reference potential GND, as it is the case in the class D amplifier 1 of FIG. 1. However, the amplifier 2' furthermore comprises a balance branch 6 connected in parallel to the other branches mentioned. The supply branch 4 apart from the DC voltage supply 12 comprises the control switch 14 controlled by the input signal u1. The control switch 14 is connected in series between the DC voltage supply 12 and the branching node N. Yet again, the control switch 14 is given by a MOSFET, the square shaped input signal u1 acting on its gate. The auxiliary branch 8 here comprises the voltage dependent current valve 22, which again is given by a Schottky diode but now is clamped in forward direction away from the reference potential GND towards the branching node N. The balance branch 6 now has the current supply device Linf, again given by a high-inductance inductor, connected in series witch the balancing device 24, again containing the rechargeable DC voltage supply 26 as energy recovery unit. Here, the rechargeable DC voltage supply is configured to supply a DC voltage of the amount of half the voltage Vdc. Again, the energy recovery unit 26 may be connected (not shown) to the DC voltage supply 12 for storing the energy that is fed back into the balance branch 6, while in this embodiment the connection preferably comprises a step-up converter. The load branch 10 here fully corresponds to the load branch 10 of the class M amplifier 2 shown in FIG. 2.

In the class-N amplifier 2', the supply branch 4, the auxiliary branch 8 and the balance branch 6 and their respective components shown in FIG. 3 form some sort of a step-down converter, the down-converted voltage being directed towards the energy recovery unit 26. The operation is in general similar to the operation of the class-M amplifier 2 shown in FIG. 2.

Figure 4:
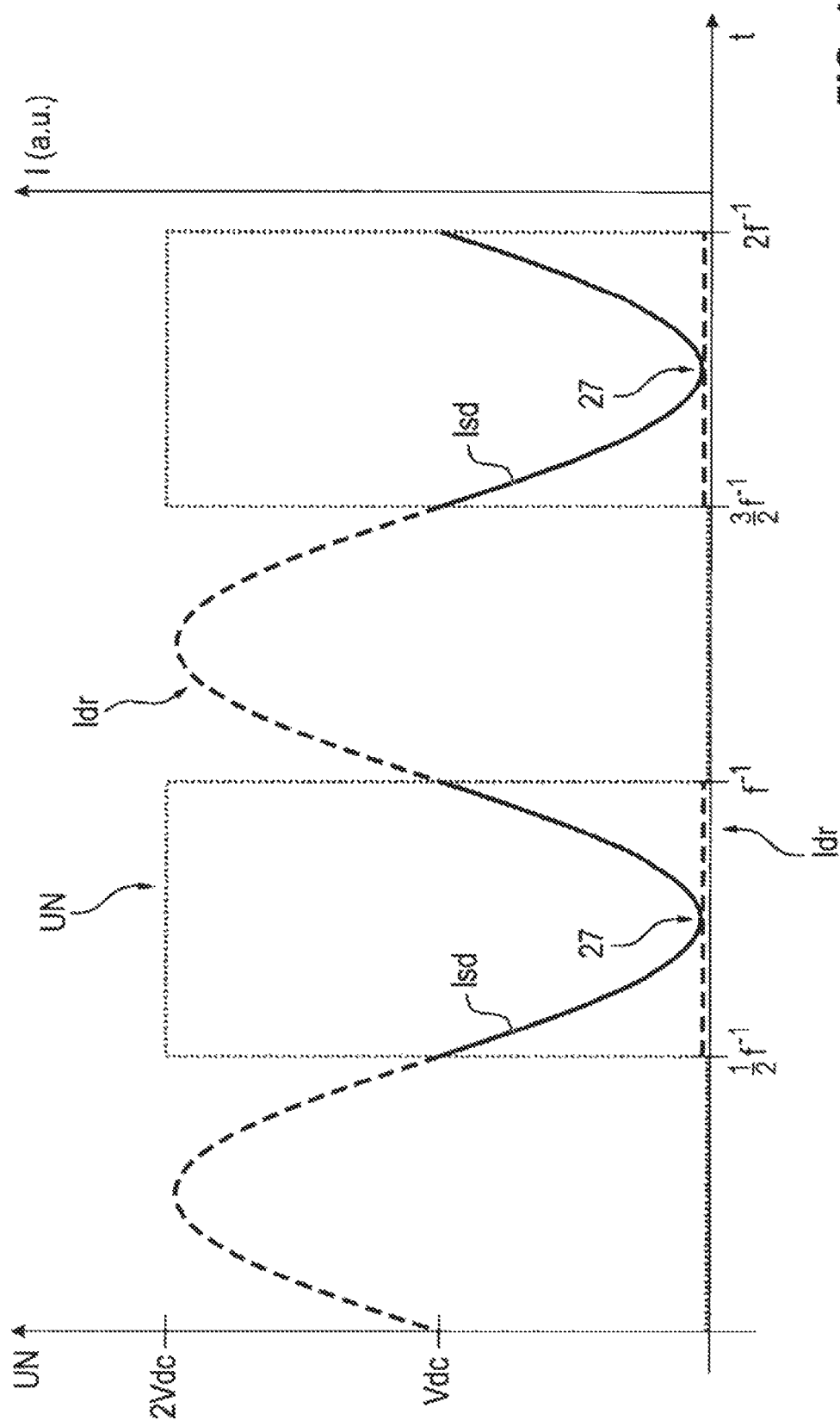
FIG. 4 shows the branching node Voltage and the current at the drain and the current valve during switching operation for an amplifier according to FIG. 2.

In FIG. 4, for the embodiment of the amplifier 2 according to FIG. 2, the temporal behavior for the voltage UN at the branching node N, the current Idr at the drain of the MOSFET embodying the control switch 14, and the current Isd through the current valve 22 embodied by a Schottky diode is shown over a time t of two full switching periods 1/f of the frequency f of the input signal u1. The current Idr (dashed line) at the drain of the MOSFET is a given by a shifted positive sine half-wave for the first half of each switching period 1/f, and essentially zero in the second half of the switching period 1/f. The current Isd (solid line) through the Schottky diode is essentially zero for the first half of each switching period 1/f, and given by a shifted negative sine half-wave for the second half of the switching period 1/f. The amplifier 2 will reach its optimal power efficiency for the Schottky diode's current staying slightly positive in the minima 27 in order to maintain the Schottky diode in a conducting state, i.e., maintaining the current valve "open". The voltage UN (dotted line) at the branching node is given as symmetrically rectangular, essentially vanishing for the first half of each switching period 1/f, and reaching the double value of the DC voltage Vdc supplied by the DC voltage supply 12 in the second half of the switching period 1/f.

Figure 5:
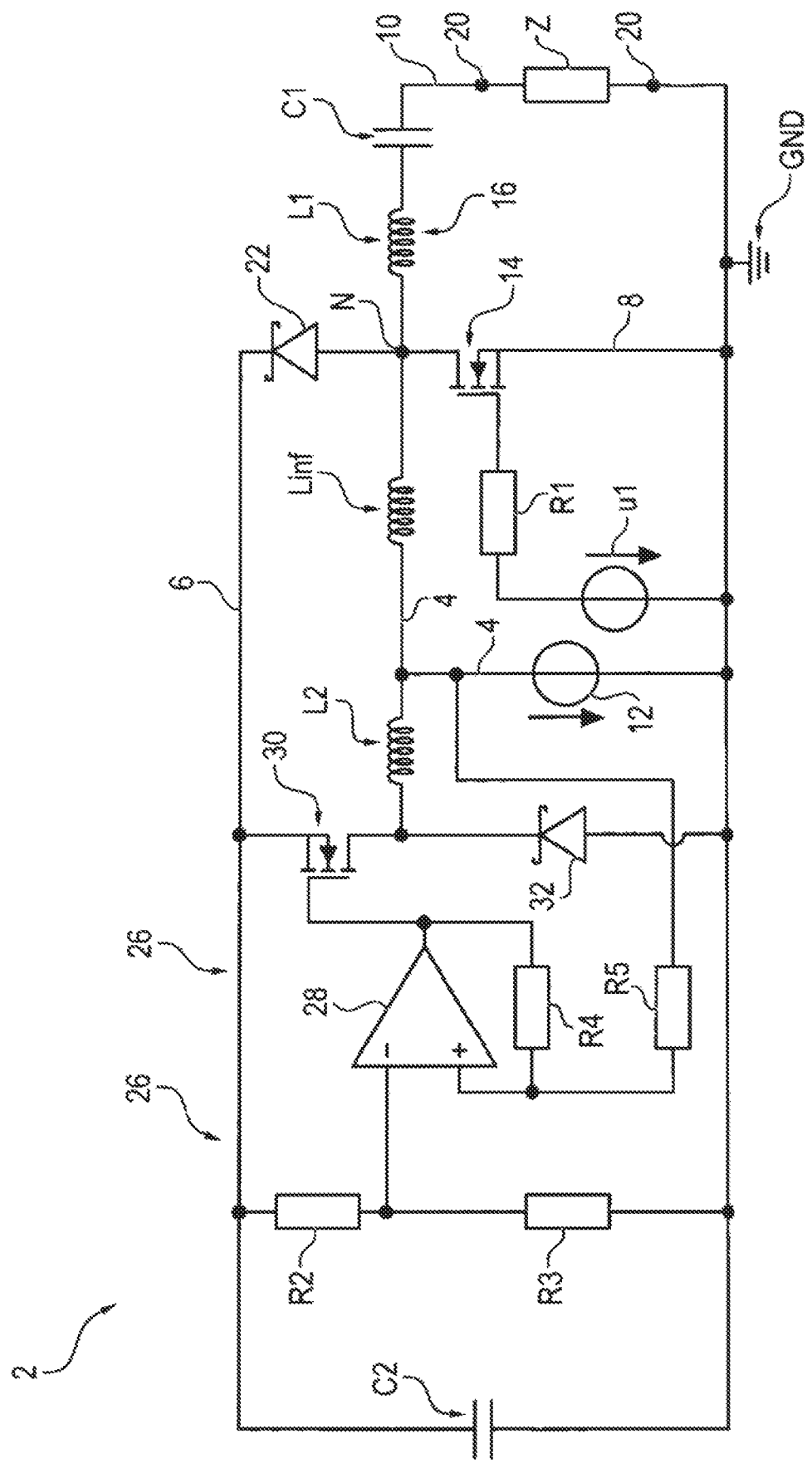
FIG. 5 shows a schematic diagram of the amplifier according to FIG. 2 comprising an energy recovery unit.

In FIG. 5, a schematic diagram of the amplifier 2 according to FIG. 2 comprising an energy recovery unit 26 is shown. The load branch 10 and the auxiliary branch 8—apart from a resistor R1 in series connection between the input signal u1 and the control switch 14—are the same as in FIG. 2. The balance branch 6 now comprises an energy recovery unit 26 which is configured to feed back additional energy from the current passing through the current valve 22 back into the DC voltage supply 12 of the supply branch 4. To this end, an operational amplifier 28 triggers a trigger switch 30, which, together with an inductor L2 and a Schottky diode 32, forms a step-down converter so that the voltage in the balance branch gets down-converted before being fed back into the supply branch. For operating the trigger switch 30, the operational amplifier receives as an input a fraction of the voltage in the balance branch 6 via a resistive voltage divider comprising the resistors R2 and R3. This fraction of the voltage in the balance branch 6 essentially gets compared to the voltage in the supply branch 4 via a resistor R5. Whenever the voltage in the balance branch 6 exceeds the voltage in the supply branch 4 by a given factor determined by the resistors R2, R3, R4 and R5, the trigger switch 30 is opened. A parallel capacitor C2 helps filter voltage peaks due to switching.

Even though the invention has been illustrated and described in detail with help of a preferred embodiment example, the invention is not restricted by this example. Other variations can be derived by a person skilled in the art without leaving the extent of protection of this invention.

The following is a summary list of reference numerals and the corresponding structure used in the above description of the invention:

1 amplifier of class D
2 amplifier of class M
2' amplifier of class N
4 supply branch
6 balance branch
8 auxiliary branch
10 load branch
12 DC voltage supply
14 control switch
16 band pass filter
18 control switch
20 connection port
22 current valve
24 balance device
26 energy recovery unit
27 minimum (of Isd)
28 operational amplifier
30 trigger switch
32 Schottky diode
C1 capacitor (of the band pass filter)
C2 capacitor (of the energy recovery unit)
GND reference potential
L1 inductor (of the band pass filter)
L2 inductor (of the energy recovery unit)
Linf current supply device
N branching node
R1-5 resistor
u1 input signal
u1 complementary input signal
Vdc DC voltage
Z load

The invention claimed is:

1. An electronic amplifier for amplifying an input signal, the amplifier comprising:
   a branching node;
   a plurality of branches connected in parallel to one another relative to said branching node and a reference potential, said plurality of branches including a supply branch, a balance branch, an auxiliary branch and a load branch;
   said supply branch including at least one DC voltage supply configured to supply a DC voltage to said branching node;
   said balance branch including a balancing device configured to absorb and/or store electric energy;
   a current supply device configured to supply a DC current;
   a control switch to be switched between a pass current state and a block current state in dependence of the input signal;
   a voltage-dependent current valve configured to conduct a substantial DC current in one direction;
   each of said control switch, said current valve and said current source being disposed in a different one of said supply branch, said balance branch and said auxiliary branch;
   said control switch being configured, in the pass current state, to establish a current flow from said supply branch through said current supply device into either said auxiliary branch or said balance branch; and
   said control switch being configured, in the block current state, to establish a current flow from said current supply device to said balancing device by way of said current valve; and
   said supply branch, said balance branch and said auxiliary branch being configured to provide an amplified signal to said load branch, the amplified signal being controlled only by the input signal at said control switch.

2. The amplifier according to claim 1, wherein:
said current supply device is disposed in said supply branch;
said current valve is disposed in said balance branch; and
said control switch is disposed in said auxiliary branch;
said control switch in the pass current state is configured to establish a current flow from said supply branch through said current supply device into said auxiliary branch; and
said control switch in the block current state is configured to establish a DC current flow from said current supply device through said current valve to said balancing device.

3. The amplifier according to claim 2, wherein:
said current valve is connected in series between said branching node and said balancing device; and/or
said control switch is connected in series between said branching node and the reference potential.

4. The amplifier according to claim 1, wherein:
said current supply device is disposed in said balance branch;
said current valve is disposed in said auxiliary branch; and
said control switch is disposed in said supply branch;
said control switch in the pass current state is configured to establish a current flow from said supply branch through said current supply device into said balance branch; and
said control switch in the block current state is configured to establish a DC current flow from said current valve through said current supply device to said balancing device.

5. The amplifier according to claim 4, wherein:
said current valve is connected in series between the reference potential and said branching node; and/or
said control switch is connected in series between the DC voltage supply and said branching node.

6. The amplifier according to claim 1, wherein said load branch further comprises a band pass filter connected in series with a connection port, said band pass filter being configured to filter a filter frequency band at a center frequency matching a working frequency of a load.

7. The amplifier according to claim 6, further configured to amplify an input signal at a frequency corresponding to the center frequency of said band pass filter.

8. The amplifier according to claim 1, wherein said current supply device is at least one inductor.

9. The amplifier according to claim 1, wherein said balancing device comprises an energy recovery unit configured to store energy from a DC current led into said balance branch.

10. The amplifier according to claim 9, wherein said energy recovery unit comprises a rechargeable DC voltage supply or is connected with a rechargeable DC voltage supply.

11. The amplifier according to claim 10, wherein said rechargeable DC voltage supply is configured to supply a DC voltage to said branching node via said supply branch.

12. The amplifier according to claim 1, wherein said balancing device comprises an energy sink configured to absorb energy from a DC current conducted into said balance branch.

13. The amplifier according to claim 12, wherein said energy sink comprises at least one resistor and one capacitor in parallel connection.

14. The amplifier according to claim 1, wherein said current valve is one of a MOSFET and a Schottky diode, said Schottky diode being clamped in forward direction towards said balancing device.

15. The amplifier according to claim 1, configured to amplify a substantially square-shaped input signal.

16. The amplifier according to claim 1, wherein said control switch is a transistor having a base and a gate, and the input signal is provided to either said base or said gate of said transistor.

* * * * *